United States Patent
Sivarajah et al.

(10) Patent No.: US 11,349,481 B1
(45) Date of Patent: May 31, 2022

(54) I/O TRANSMITTER CIRCUITRY FOR SUPPORTING MULTI-MODES SERIALIZATION

(71) Applicant: SKYECHIP SDN BHD, Pulau Pinang (MY)

(72) Inventors: Selvakumar Sivarajah, Pulau Pinang (MY); Soon Chieh Lim, Pulau Pinang (MY); Chee Hak Teh, Pulau Pinang (MY); Tze Jian Chow, Pulau Pinang (MY)

(73) Assignee: SKYECHIP SDN BHD, Bayan Lepas (MY)

( * ) Notice: Subject to any disclaimer, the term of this patent is extended or adjusted under 35 U.S.C. 154(b) by 0 days.

(21) Appl. No.: 17/201,989

(22) Filed: Mar. 15, 2021

(30) Foreign Application Priority Data

Feb. 19, 2021 (MY) .............................. PI2021000907

(51) Int. Cl.
  *H03K 19/17736* (2020.01)
  *H03K 19/173* (2006.01)

(52) U.S. Cl.
  CPC ... *H03K 19/17744* (2013.01); *H03K 19/1737* (2013.01)

(58) Field of Classification Search
  None
  See application file for complete search history.

(56) References Cited

U.S. PATENT DOCUMENTS

| | | | |
|---|---|---|---|
| 7,982,638 B2 * | 7/2011 | Yamaguchi | H03M 9/00 341/101 |
| 8,912,933 B1 | 12/2014 | Zhang et al. | |
| 9,281,969 B2 | 3/2016 | Gondi et al. | |
| 9,310,830 B2 | 4/2016 | Fiedler | |
| 2020/0409408 A1 * | 12/2020 | Nair | G06F 1/10 |

\* cited by examiner

*Primary Examiner* — Jany Richardson
(74) *Attorney, Agent, or Firm* — Aslan Law, P.C.

(57) ABSTRACT

A I/O transmitter circuitry for supporting multi-modes serialization comprising a serializer, wherein said serializer comprising a multiple FIFO buffers, a multiple flip-flops including a first latch, a second latch, a third flop and a fourth flop, to hold data ready and stage the data for subsequent muxing, a 0-degree shifted clock and a 90-degree shifted clock and a multiplexer, wherein a read pointer reads one bit of data from each of the FIFO buffers, wherein the data is sampled into the respective flip-flops according to frequency of the 0-degree shifted clock and 90-degree shifted clock, wherein the data is outputted by the 0-degree shifted clock and 90-degree shifted clock via the multiplexer.

11 Claims, 10 Drawing Sheets

I/O TRANSMITTER CIRCUITRY FOR SUPPORTING MULTI-MODES SERIALIZATION

CROSS-REFERENCE TO RELATED APPLICATIONS

This application claims priority to MY Patent Application No. PI2021000907 filed on Feb. 19, 2021, the entire contents of which are hereby incorporated by reference.

TECHNICAL FIELD

This invention relates to a serialization. More particularly, the present invention relates to a I/O transmitter circuitry for supporting multi-modes serialization.

BACKGROUND ART

Conventionally, to support multiple modes serialization, multiple dedicated serializers could be instantiated and multiplexed at the output to a single driver. However, the timing closure is harder to achieve due to separate timing paths. Besides that, for de-emphasis and pre-emphasis equalization, a separate driver is commonly used along the main driver. This would also incur additional pad capacitance which degrades the overall performance and timing of the transmit path.

U.S. Pat. No. 9,310,830B2 discloses a high-speed I/O data system, a first computer chip includes a data transmission system, and a second computer chip includes a data reception system. A data channel communicates an NRZ data signal, and a clock channel communicates a forwarded clock signal, from the data transmission system to the data reception system. The data transmission system includes a first differential serializing transmitter to generate the NRZ data signal from pulsed data, and further includes a second differential serializing transmitter to generate a forwarded clock signal. A first multi-phase transmit clock generator generates transmit clock signals for the first and second differential serializing transmitters. The data reception system includes a data receiver and a de-serializer to receive and de-serialize the NRZ data signal, and includes a multiphase receive clock generator to generate receive clock signals from the forwarded clock signal for the de-serializing data receiver.

U.S. Pat. No. 9,281,969B2 discloses a configurable multimode driver and receiver. An embodiment of a communication system includes a communication channel, and a first device and a second device coupled with the communication channel. The first device includes a driver apparatus to drive data signals on the communication channel, the driver apparatus including circuits to receive and drive the data signals, where the circuits are configurable for termination resistance of the driver circuit apparatus, and each of the plurality of circuits is comprised of one or more circuit units, the circuit units being configurable for equalization control of the driver apparatus. The second device includes a receiver to receive data signals from the communication channel as an input. Either the first device or the second device includes configurable circuit elements to provide signal reflection control for the system.

U.S. Pat. No. 8,912,933B1 discloses a serializer has a transfer stage that transfers N-bit parallel data from a relatively slow timing domain to a relatively fast timing domain and a serializing stage that converts the parallel data into serialized data. Between the transfer stage and the serializing stage is an update stage that buffers the data and can be used to toggle the serializer between an N−1 operating mode and an N+1 operating mode.

The aforementioned references may strive to provide multi-modes serialization. Nevertheless, they have a number of limitations and shortcomings. For instance, the transmit equalizer architectures obtain the future data by adding a pipe-stage delay to the datapath, and then taking the current cycle's data as future data, while using the previous cycle's data as current data. This has the negative effect of adding 1 cycle latency (i.e. the output is delayed). Also prior arts only utilizes other signals such as OCT to control the drive strength of the output drivers. Accordingly, there remains a need to have an improved I/O transmitter circuitry for supporting multi-modes serialization.

SUMMARY OF THE INVENTION

The following presents a simplified summary of the invention in order to provide a basic understanding of some aspects of the invention. This summary is not an extensive overview of the invention. Its sole purpose is to present some concepts of the invention in a simplified form as a prelude to the more detailed description that is presented later.

It is an objective of the present invention to provide a configurable serialization of using the same I/O transmitter to support both 4:1 and 2:1 serializer modes with equalization features including de-emphasis and pre-emphasis.

It is also an objective of the present invention to provide a configurable equalization coefficient and modes through multiple ratio-ed TX driver segments.

It is yet another objective of the present invention to provide a configurable merged I/O providing a high-speed serialization path and a bypass transmit path to allow direct asynchronous transfers with low pad capacitance.

It is a further objective of the present invention to use output enable to control the output drivers' drive strength and termination on the pad allowing for a more relaxed OCT timing to prevent contention.

Accordingly, these objectives may be achieved by following the teachings of the present invention. The present invention relates to a I/O transmitter circuitry for supporting multi-modes serialization comprising a serializer, characterized in that said serializer comprising a multiple FIFO buffers, a multiple flip-flops including a first latch, a second latch, a third flop and a fourth flop, to hold data ready and stage the data for subsequent muxing, a 0-degree shifted clock and a 90-degree shifted clock and a multiplexer, wherein a read pointer reads one bit of data from each of the FIFO buffers, wherein the data is sampled into the respective flip-flops according to frequency of the 0-degree shifted clock and 90-degree shifted clock, wherein the data is outputted by the 0-degree shifted clock and 90-degree shifted clock via the multiplexer.

The present invention also relates to a method of operating a I/O transmitter circuitry for supporting 4-to-1 serialization, characterized by the steps of, reading bits of data from each FIFO buffers by a read pointer, capturing the output from each FIFO buffers by two latches and two flops and outputting the data from the two latches and two flops by a multiplexer based on a 0-degree shifted clock and a 90-degree shifted clock.

Further, the present invention relates to a method of operating a I/O transmitter circuitry for supporting 2-to-1 serialization, characterized by the steps of, reading bits of data from each FIFO buffers by a read pointer and capturing the output from each FIFO buffers by two latches and two flops, determining 2-to-1 mode serialization, operating 0-degree shifted clock to drive same clock signals, replacing third flop path by a second latch and outputting the data from the second latch or fourth flop by a multiplexer.

The foregoing and other objects, features, aspects and advantages of the present invention will become better understood from a careful reading of a detailed description provided herein below with appropriate reference to the accompanying drawings.

BRIEF DESCRIPTION OF THE DRAWING

So that the manner in which the above recited features of the present invention can be understood in detail, a more particular description of the invention, briefly summarized above, may have been referred by embodiments, some of which are illustrated in the appended drawings. It is to be noted, however, that the appended drawings illustrate only typical embodiment of this invention and is therefore not to be considered limiting of its scope, for the invention may admit to other equally effective embodiments.

These and other features, benefits, and advantages of the present invention will become apparent by reference to the following text figure, with like reference numbers referring to like structures across the view, wherein.

DETAILED DESCRIPTION OF THE INVENTION

Figure 1:
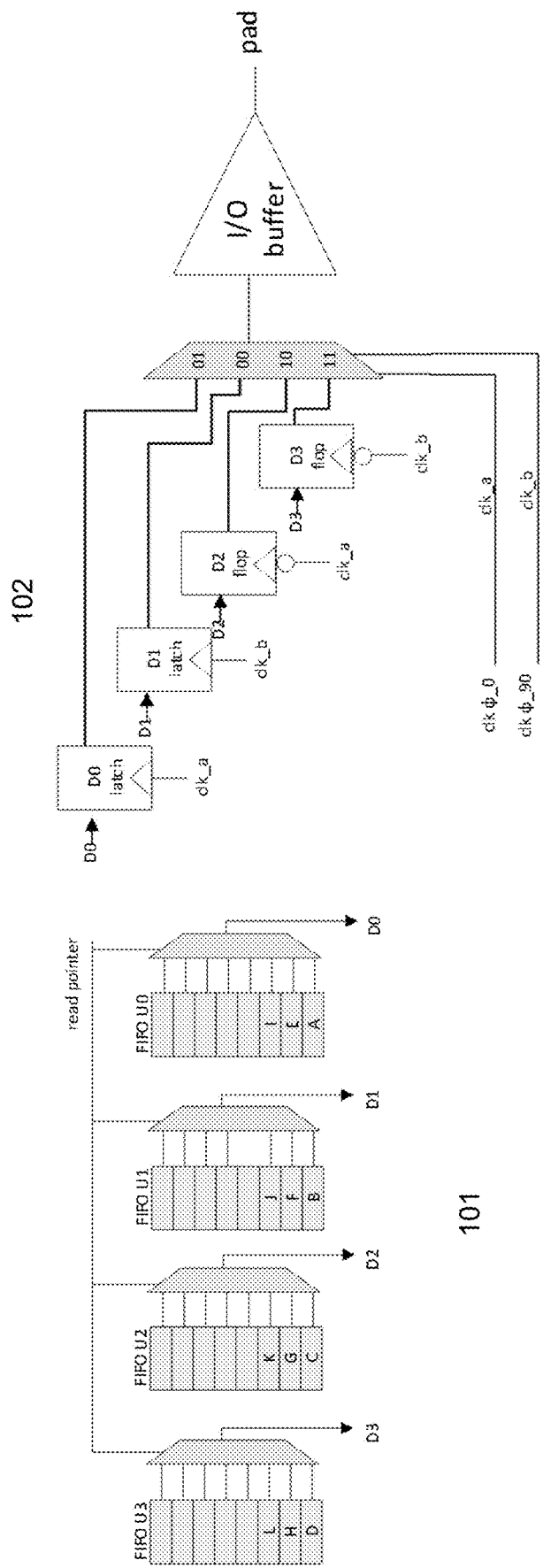
FIG. 1 shows a diagram of a 4-to-1 serializer basic structure according to an embodiment of the present invention.

As required, detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting but merely as a basis for claims. It should be understood that the drawings and detailed description thereto are not intended to limit the invention to the particular form disclosed, but on the contrary, the invention is to cover all modifications, equivalents and alternatives falling within the scope of the present invention as defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to. Further, the words "a" or "an" mean "at least one" and the word "plurality" means one or more, unless otherwise mentioned. Where the abbreviations or technical terms are used, these indicate the commonly accepted meanings as known in the technical field.

The present invention is described hereinafter by various embodiments with reference to the accompanying drawings, wherein reference numerals used in the accompanying drawings correspond to the like elements throughout the description. This invention may, however, be embodied in many different forms and should not be construed as limited to the embodiment set forth herein. Rather, the embodiment is provided so that this disclosure will be thorough and complete and will fully convey the scope of the invention to those skilled in the art. In the following detailed description, numeric values and ranges are provided for various aspects of the implementations described. These values and ranges are to be treated as examples only, and are not intended to limit the scope of the claims. In addition, a number of materials are identified as suitable for various facets of the implementations. These materials are to be treated as exemplary, and are not intended to limit the scope of the invention.

Referring to the drawings as shown in FIGS. 1 to 10, the invention will now be described in more details.

The present invention relates to a I/O transmitter circuitry (100) for supporting multi-modes serialization, the I/O transmitter circuitry (100) comprising a serializer (103), characterized in that said serializer (103) comprising a multiple FIFO buffers (101), a multiple flip-flops (102) including a first latch, a second latch, a third flop and a fourth flop, to hold data ready and stage the data for subsequent muxing, a 0-degree shifted clock and a 90-degree shifted clock and a multiplexer, wherein a read pointer reads one bit of data from each of the FIFO buffers (101), wherein the data is sampled into the respective flip-flops (102) according to frequency of the 0-degree shifted clock and 90-degree shifted clock, wherein the data is outputted by the 0-degree shifted clock and 90-degree shifted clock via the multiplexer as shown in FIG. 1.

In accordance with an embodiment of the present invention, the serializer (103) comprises four FIFO buffers (101), each coupled to one of the multiple flip-flops (102) to support 4-to-1 serialization.

Figure 2:
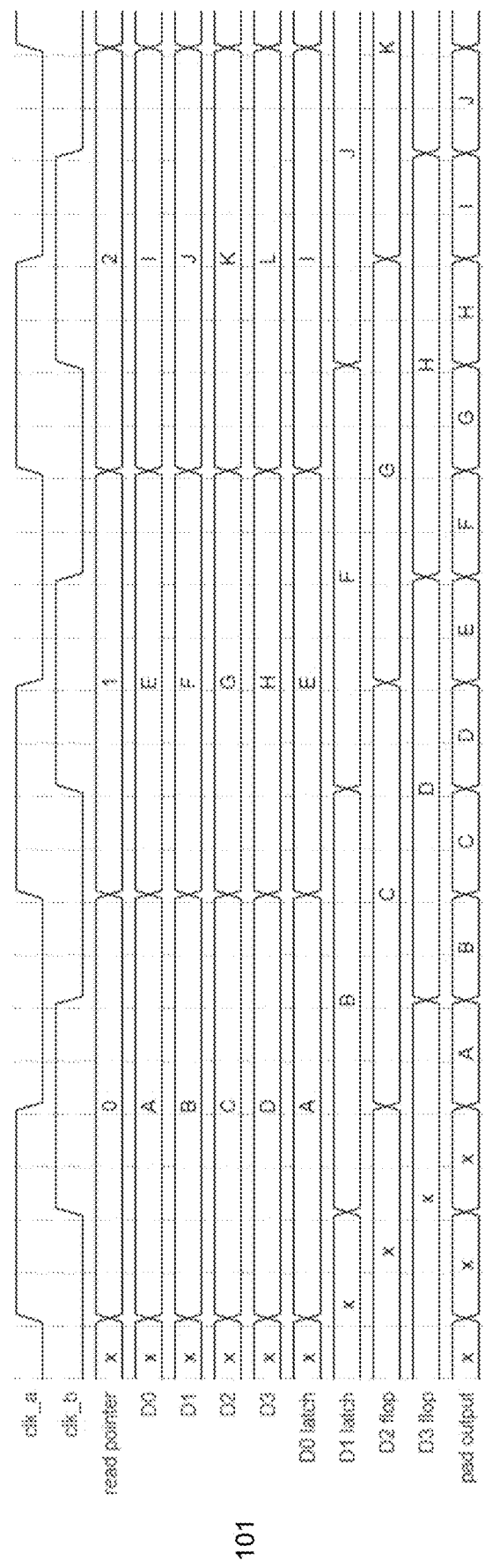
FIG. 2 shows a timing diagram of the 4-to-1 serializer structure according to an embodiment of the present invention.

In accordance with an embodiment of the present invention, the data to be transmitted is first stored in the multiple FIFO buffers (101) named FIFO U0, U1, U2, U3. The read pointer reads out 4 bits of data, one from each FIFO buffer. The output from each FIFO: D0, D1, D2, D3, are then captured by 2 latches and 2 flip-flops. The first output, D0 is sampled into the D0 latch when signal from the 0-degree shifted clock (clk_a) is high. The second output, D1 is sampled by the D1 latch when signal from the 90-degree shifted clock (clk_b) is high. The third output, D2 is sampled by the D2 flop on the falling edge of clk_a, while the final output D3 is sampled by the D3 flop on the falling edge of clk_b. The purpose of using the multiple flip-flops (102) are to hold the data ready and stage them for the subsequent 4-to-1 muxing. In the 4-to-1 serialization mode, clk_a is driven by the 0-degree shifted clock (also known as "clk φ_0"), while clk_b is driven by the 90-degree shifted clock (also known as "clk φ_90"). A 4-to-1 serializing mux, where the 2-bit select comes from both clk_a and clk_b, takes in the data from the 4 latches/flops and output them one by one. For example:

1) when clk_a is 0 and clk_b is 1, D0 latch is transmitted as the output.
2) when clk_a is 0 and clk_b is 0, D1 latch is transmitted as the output
3) when clk_a is 1 and clk_b is 0, D2 flop is transmitted as the output
4) When clk_a is 1 and clk_b is 1, D3 flop is transmitted as the output The structure as shown in FIG. 2 achieved a 4-to-1 serialization. Note that for simplicity, the data, A, B, C, D, E etc are depicted as single-bit data in the diagram. The invention can be extended to any number of bits. For example, A, B, C, D, E etc can each represent 2-bit data, where the 2 bits are used as a 1-bit output enable (OE) and a 1-bit high or low output signal level.

Figure 3:
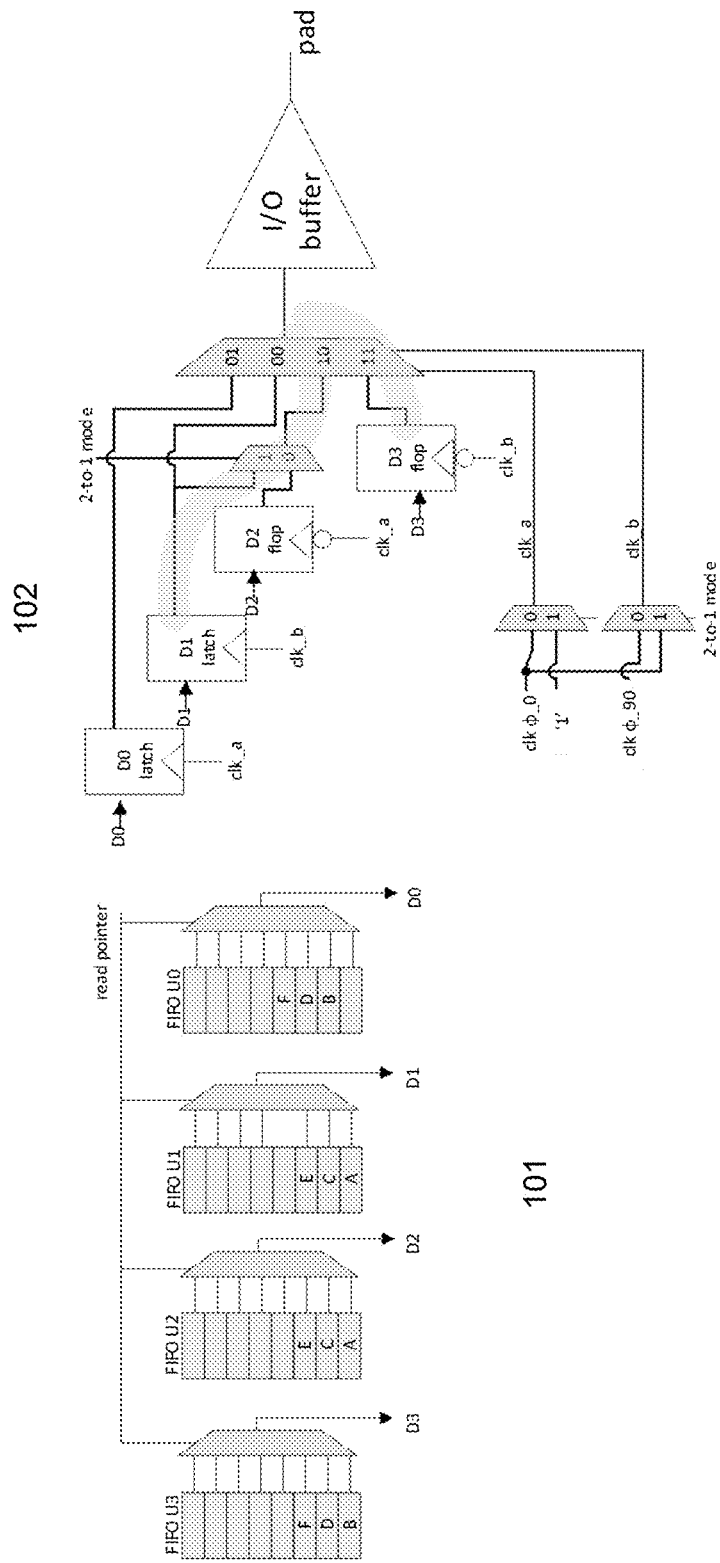
FIG. 3 shows a diagram of the addition of 2 multiplexors (mux) on the clock path, and 1 additional mux in the data path of D2 flop for 2-to-1 serialization according to an embodiment of the present invention.
Figure 4:
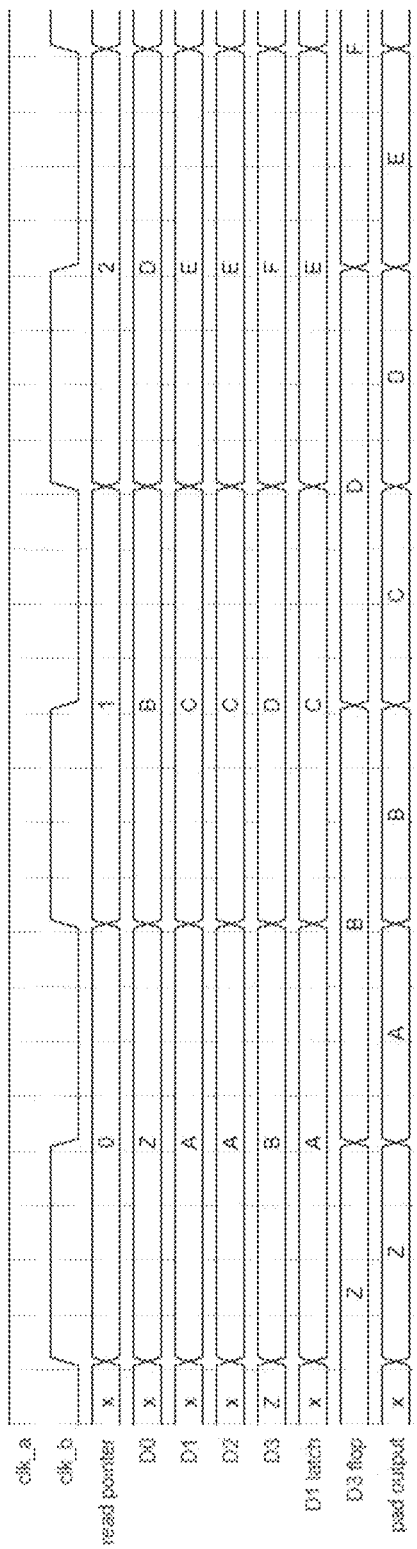
FIG. 4 shows a timing diagram of the 2-to-1 serializer structure according to an embodiment of the present invention.

In accordance with an embodiment of the present invention, wherein the serializer (103) further comprise three mux, each of the mux is coupled to the 0-degree shifted clock, the 90-degree shifted clock and the third flop respectively to support 2-to-1 serialization as shown in FIG. 3 and FIG. 4.

In accordance with an embodiment of the present invention, the I/O transmitter circuitry (100) can be easily extended to support a 2-to-1 serialization operation. In this mode, there is only a single operational clock, i.e. the 0-degree shifted clock or clk_φ_0. When 2-to-1 mode is '1', this clk_φ_0 is driven into clk_b, while at the same time a '1' is driven into clk_a.

Referring to FIG. 3, the addition of 2 multiplexors (mux) on the clock path, and 1 additional mux in the data path of D2 flop. When 2-to-1 mode is '1', the D2 flop path is replaced by the D1 latch. Essentially, the 4-to-1 mux is now only selecting the D1 latch or the D3 flop to output.

In accordance with an embodiment of the present invention, the serializer (103) further comprise an additional mux added to first of the multiple FIFO buffers (101) to support I/O equalization.

In accordance with an embodiment of the present invention, there are 2 types of equalization such as but not limited to, de-emphasis and pre-emphasis.

The de-emphasis equalization attempts to weaken the current data if the previous data (or past data) is same in value. The pre-emphasis equalization attempts to weaken the current data if the next (or future data) is opposite in value. Therefore, equalization is a function of the current data, the past data and the future data. For example, assuming the transmit FIFO outputs are in this order: U0, U1, U2, U3. For U0, the future data is U1 and the past data is the previous cycle's U3. For U1, the future data is U2, and the past data is U0. For U2, the future data is U3, and the past data is U1. For U3, the future data is the next cycle's U0, and the past data is U2. Getting the past data for U0 is simple, i.e. by flopping or delaying the current U3 into the next cycle. Obtaining the future data for U3 (i.e. next cycle's U0) requires more work.

Figure 5:
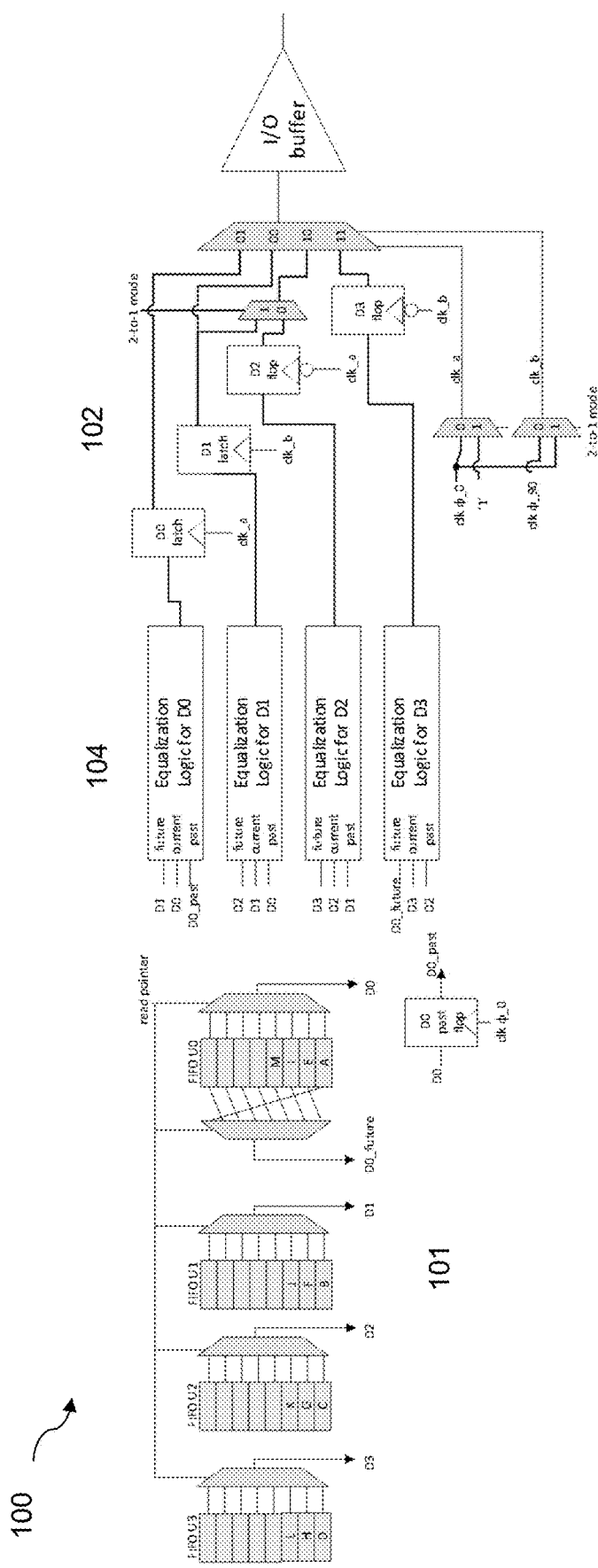
FIG. 5 shows a diagram of the 4-to-1 serializer structure incorporated with equalization logic according to an embodiment of the present invention.

In accordance with an embodiment of the present invention, the conventional problem on 1 cycle latency can be reduced by adding an additional mux to the FIFO U0, as shown in FIG. 5. If the read pointer is 0, U0's muxes will read out 'A' and 'E'. 'E' is the future data of 'D'. If the read pointer is 1, U0's muxes will read out 'E' and 'I', where 'I' is the future data of 'H'. In other words, in the current cycle, U0's muxes reading out the current and future data simultaneously from the transmit FIFOs.

The 4-to-1 serializer (103) with equalization logic (104) and transmit FIFO buffer with 5 muxes to output the 4 current data bits+1 future bit as shown in FIG. 5.

In accordance with an embodiment of the present invention, in achieving the 2-to-1 serialization mode, the data stored in the transmit FIFO buffer is shifted to the left by 1 and also doubled on every 2 FIFO locations (i.e. 'A', 'A', 'B', 'B' etc). Further at cycle 0, when the read pointer is 0, for D1 the current data is 'A'. Its past data is D0, which is 'Z' and its future data is D2 which is 'A'. For D3, its current data is 'B', its past data is D2 which is 'A' and its future data is D0_future which is 'C'. At cycle 1, when the read pointer is 1, for D1 the current data is 'C'. Its past data is D0, which is 'B' and its future data is D2 which is 'C'. For D3, its current data is 'D', its past data is D2 which is 'C' and its future data is D0_future which is 'D'.

Figure 6:
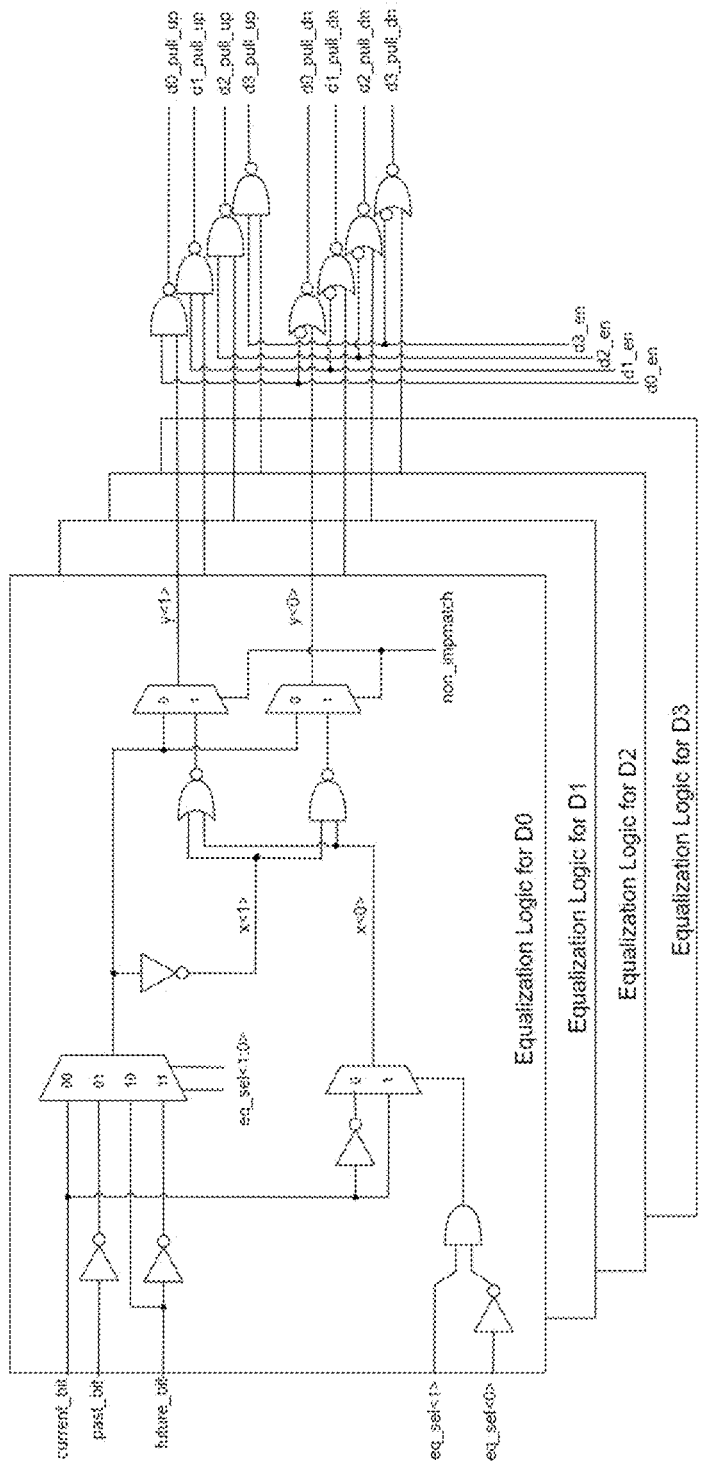
FIG. 6 shows a diagram of an equalization logic according to an embodiment of the present invention.

The equalization logic (104) is shown in FIG. 6. The equalization logic (104) contains two selection bits, and the behaviour are generalized in table 1:

TABLE 1

| eq_sel<1> | eq_sel<0> | mode |
| --- | --- | --- |
| 0 | 0 | no EQ |
| 0 | 1 | de-emphasis |
| 1 | 0 | pre-emphasis |
| 1 | 1 | pre-emphasis (inv) |

| non_impmatch | mode |
| --- | --- |
| 0 | Tx impedance seen at pad will not change during EQ state. (pullup/pulldn will turn on together during EQ, the Rthevenin formed is always equal to target Ron, main) |
| 1 | Tx impedance will change during EQ state. (pullup/pulldn will not turn on together during EQ, the driver Ron will be weaker than Ron,main) |

For "non_impmatch", the primary function is to have the capability to configure the Ron seen at the pad during equalization state. Taking de-emphasis as example, in the case where non_impmatch is set to "1", during equalization state, the serializer (103) output will simply turn off the driver to achieve a weaker drive strength. This will cause the Ron seen at the pad to be weaker than pre-equalization state. In the case where non_impmatch is set to "0", instead of turning off the driver, the opposite polarity of current state will be turned on instead. This will form a contention between the main driver and the equalization driver to alter the driver pad voltage level. In short, the equalization effect is achieved by virtue of resistor divider between the pull-up and pull-down driver. Because there are now two resistance paths on the pad, the circuit can be simplified to a Thevenin equivalent circuit where the Rthevenin seen at the pad will be equal to the Ron seen at the pad during pre-equalization state.

For eq_sel options, in the scenario where eq_sel<1:0> is equal to 2'b00, no equalization is enabled, hence the output will be equal to the current_bit. In the scenario where eq_sel<1:0> is equal to 2'b01, de-emphasis equalization is enabled, the output will be decided based on the relationship between past_bit & current_bit. If the current_bit is the same state as past_bit, the serializer (103) output will weaken the driver using either one of the methods described by non_impmatch settings.

In the scenario where eq_sel<1:0> is equal to 2'b10, pre-emphasis is enabled, the output will be decided based on the relationship between future_bit & current_bit. If the future_bit is opposite polarity of current bit, the serializer (103) output will weaken the driver using either one of the methods described by non_impmatch settings.

In the scenario where eq_sel<1:0> is equal to 2'b11, it is essential similar as pre-emphasis, the only difference is the serializer (103) output is inverted.

In accordance with an embodiment of the present invention, the I/O transmitter circuitry (100) further comprising a bypass path from an external logic and a bypass mux (106) to allow direct asynchronous communication and receiving mode termination.

In accordance with an embodiment of the present invention, the I/O transmitter circuitry (100) further comprising an output enable pin to control the output drivers drive strength and termination on the pad.

In accordance with an embodiment of the present invention, the bypass path support enable direct asynchronous communication and RX mode termination type control at the non-timing critical path. In accordance with an embodiment of the present invention, the bypass path added where the serializer (103) is bypassed for a direct drive from external logic without going through this transmit datapath (FIFO/pipeline/equalization/latch/flop). When bypass mode is enabled, both clk_a and clk_b are forced to 11, and the 4-to-1 serialization mux will take only from the D3 path which is also bypassed (with the addition of a bypass mux) (106) to the input bypass data.

Figure 7:
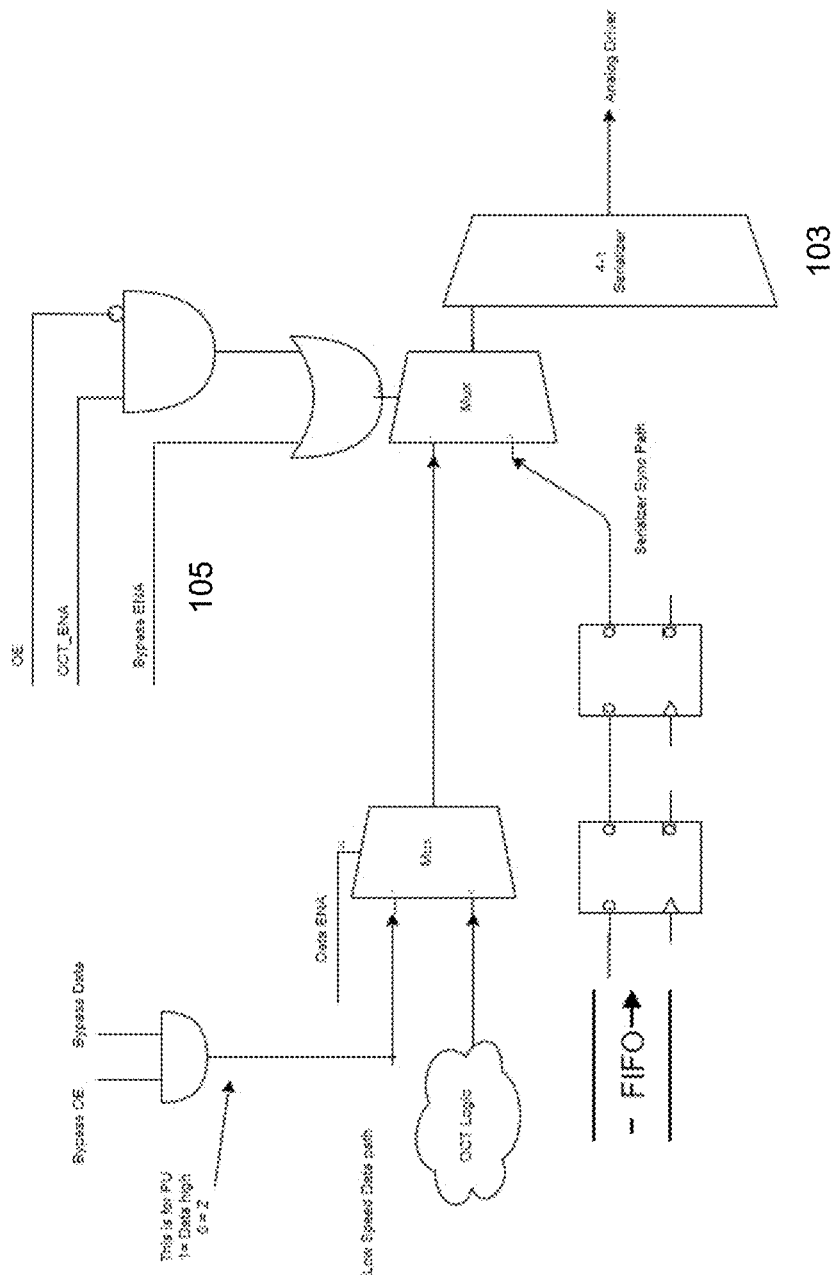
FIG. 7 shows a diagram of addition of additional logic for bypass and termination according to an embodiment of the present invention.

In accordance with an embodiment of the present invention, the I/O transmitter circuitry (100) includes additional logic to handle the transition from an output direction (write, or transmit) to an input direction (read or receive). To control the transition from read to write, an vice versa, an OE signal (output enable) is used. During transmit, when OE is high, the normal path as described earlier through the transmit FIFOs will go through the datapath and driven out on the pad. When OE is low, then the output drivers are being tristated (i.e. turned off and not driving anything). Optionally, when OE is low, the output driver can actually be turned on, albeit with a weak drive strength to help on signal integrity on the pad during receive operation. This is also known as on-chip-termination or OCT (or on-die-termination or ODT in some systems). As shown in FIG. 7 the additional logic added. When OE==0, OCT_ENA==1, DATA_ENA==0, then the OCT logic is chosen which will drive both the pull-up/pull-down on the analog output drivers, thus creating a weak contention on the pad which is actually useful for signal integrity during receive operation.

Referring to FIG. 7 which also shows Bypass ENA (105) and Data ENA. Both are asserted during a bypass operation, where it will be totally bypass the transmit FIFOs and OE/OCT. Therefore, the bypass operation has the highest priority.

Figure 8:
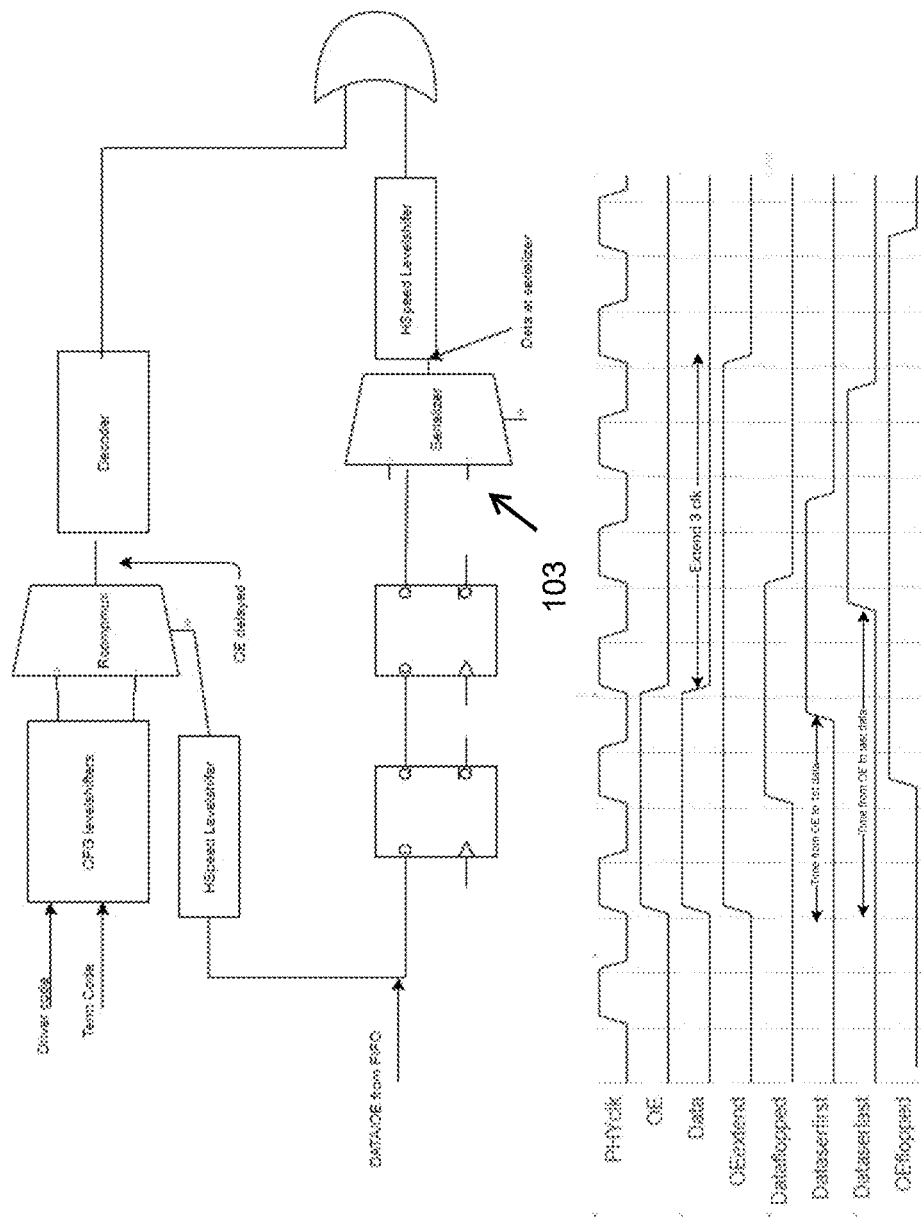
FIG. 8 shows a diagram of an early output enable (OE) is taken to select the RCOMP driver codes when transitioning from receive to transmit according to an embodiment of the present invention.

In accordance with an embodiment of the present invention, one characteristics of the invention is the use of the output enable, OE to not only control the on or off of the output drivers, but also used to determine the drive strength of the output drivers dynamically. Previously described the case when OE==1, which is in transmit mode and the output drivers required to drive data on the Pad. When OE==0, and OCT==1, which is in on-chip-termination mode where it required to drive a weak contention (both pull-up and down turned on) on the Pad. Hence, OE is also used to select the drive strength codes, or what is known as Resistance Compensation codes (RCOMP) (or also known as impedance control in some other systems). OE==1 will select transmit/driver codes, and OE==0 will select weak termination codes. However, careful timing of OE is needed as it may cut off data midway or codes to switch midway. As shown in FIG. 8 an early OE is taken to select the RCOMP driver codes when transitioning from receive to transmit. During transmit to receive transition, OE is extended by 3 clocks to ensure driver codes are not changed until the last data is out on the Pad.

In accordance with an embodiment of the present invention, early OE is the OE before it gets flopped at the serializer (103). The OE that translates to data being sent out happens 1.5clocks later which is OE combined with the serialize data. Here the Early OE needs fast to ensure decoder change is completed before the serializer (103) starts to send data out.

Figure 9:
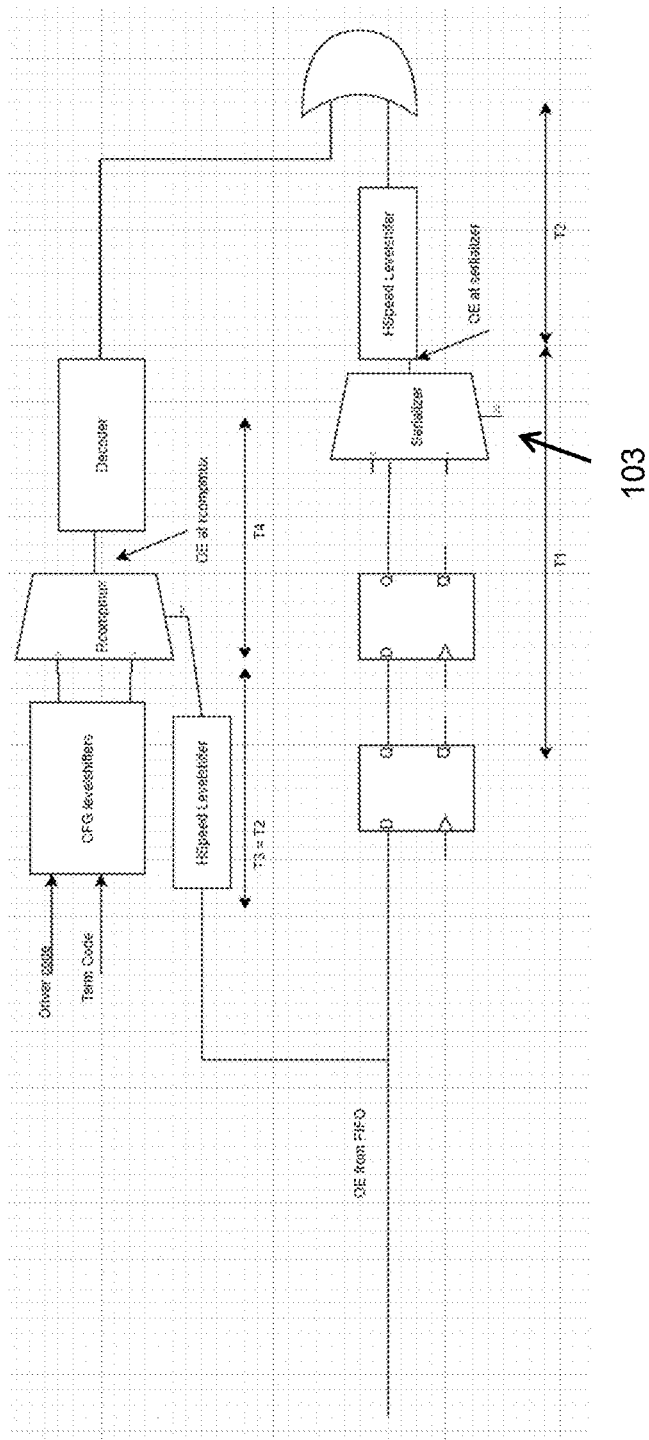
FIG. 9 shows a diagram an early OE according to an embodiment of the present invention.

As shown in FIG. 9, early OE has to be fast enough such that it can fulfil the equations T3+T4<T1+T2 and T4<T1. Here T4 is the delay of the slowest decoder in addition to the mux. T1 is the time it takes for OE from FIFO buffer to serializer (103) output. Theoretically worst case T1(fastest) would be 1.5clocks.

In accordance with an embodiment of the present invention, the extended OE is a feature required when OE is de-asserted for read. Also, it is established that OE will reach the decoder faster compared to the serializer (103). This would create an issue as the decoder will change codes before OE has finished sending data. In this case the system is required to extend OE by several cycles. Here the OE need to be extended by calculating for instance T4(min)−T1(max). If T4(min)−0. The amount of time OE needs to be extended is T1(max) which equals to 2 clocks (2flops)+time it takes for last serialized data to be transmitted (1clk). 3 clock cycle is the minimum used in this invention, however any number of clocks larger than 3 can be used for better margin.

The present invention relates to a method of operating a I/O transmitter circuitry (100) for supporting 4-to-1 serialization, characterized by the steps of reading bits of data from each FIFO buffers (101) by a read pointer, capturing the output from each FIFO buffers (101) by two latches and two flops and outputting the data from the two latches and two flops by a multiplexer based on a 0-degree shifted clock and a 90-degree shifted clock.

In accordance with an embodiment of the present invention, wherein reading bits of data including current data and future data simultaneously from each FIFO buffers (101) by a read pointer for I/O equalization.

The present invention relates to a method of operating a I/O transmitter circuitry (100) for supporting 2-to-1 serialization, characterized by the steps of reading bits of data from each FIFO buffers (101) by a read pointer and capturing the output from each FIFO buffers (101) by two latches and two flops, determining 2-to-1 mode serialization, operating 0-degree shifted clock to drive same clock signals, replacing third flop path by a second latch and outputting the data from the second latch or fourth flop by a multiplexer.

In accordance with an embodiment of the present invention, wherein shifting data in the FIFO buffers (101) to the left by 1 and doubling the data on every two FIFO locations before reading bits of data for I/O equalization.

In accordance with an embodiment of the present invention, wherein reading out the future data and current data simultaneously from a FIFO without incurring additional cycle delay.

Figure 10:
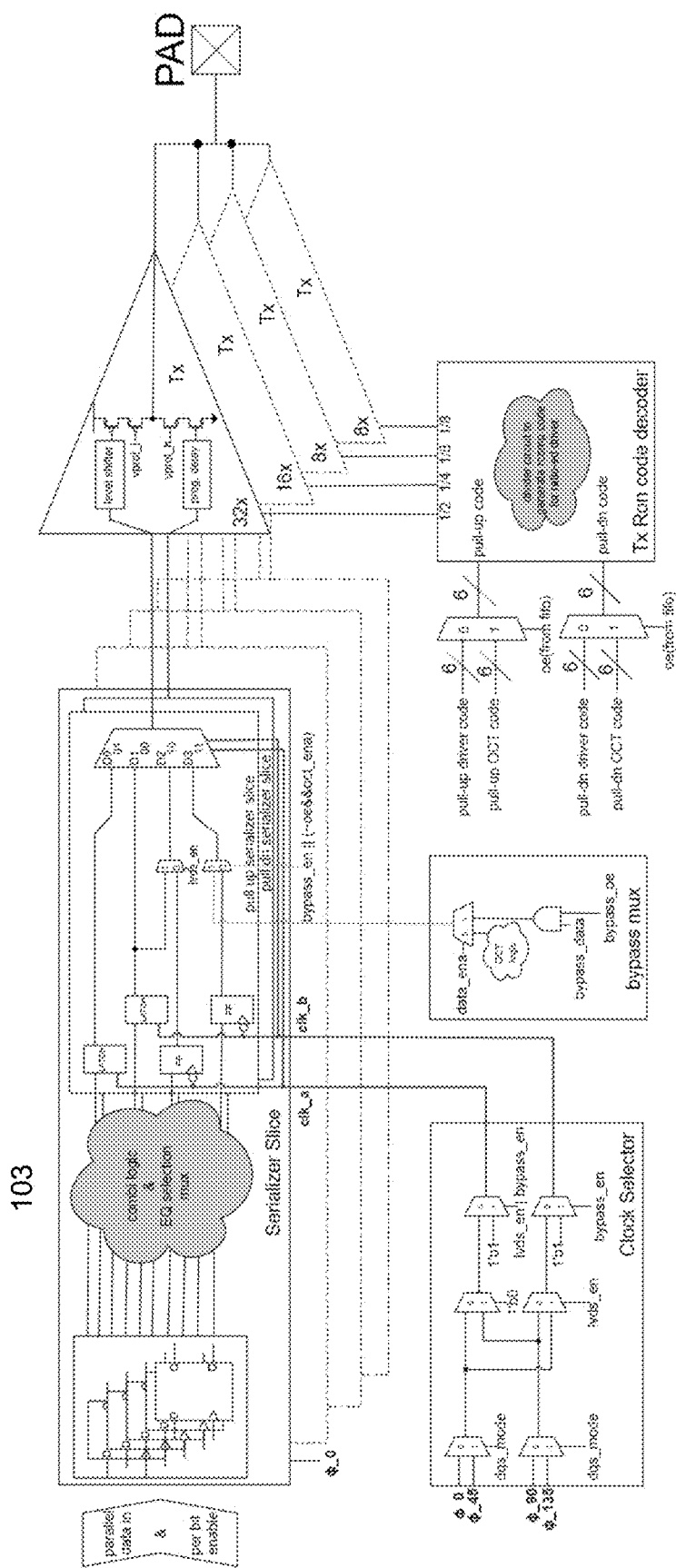
FIG. 10 shows an overall diagram of the I/O transmitter with the serializer according to an embodiment of the present invention.

In accordance with an embodiment of the present invention, the slice of logic can be duplicated into multiple times, the output of each will drive a parallel output driver of different strength as shown in FIG. 10 as the final stage. All the parallel output drivers are ganged together to drive the final output pad. By varying the equalization logic (104) selection for each slice, and by varying the final impedance code (Ron code decoder), one can achieve a wide range of possibilities for transmit equalization and drive strength.

The overall transmitter (Tx) with the serializer (103) is shown in FIG. 10, the serializer (103) slice discussed before can be duplicated N times to controlled N amount of ratio-ed driver. In the FIG. 10, 4 serializer (103) slice are paired with 4 ratio-ed Tx drivers with 32×, 16×, 8×, 8× drive strength. By having 4 dedicated controls on equalization settings, the equalization coefficient can be configured in broader combinations.

The Tx Ron code decoder is a dividing circuit that will take in the 6-bit input and divide the code down following the ratio assigned to the ratio-ed Tx drivers. There are 2 sets of code for pull-up and pull-down respectively, 1st set is used for normal functional Tx mode, while the 2nd set is used for "on-chip-termination" mode, which is turned on to act as pad termination during non-transmit mode.

Based on the full invention schematic, some of common I/O standard that can be configured (but not limited to) are listed in table 3 below.

TABLE 3

| standard | clk_a | clk_b | serializer input | output datarate/ input clk freq |
|---|---|---|---|---|
| DDR*/LPDDR*, DQ | $\varphi\_0$ | $\varphi\_90$ | d0_pre,d0,d1,d2,d3 | 4:1 |
| DDR*/LPDDR*, DQS | $\varphi\_45$ | $\varphi\_135$ | x,0,1,0,1 | 4:1 |
| LVDS | 1'b1 | $\varphi\_0$ | x,d0_post,d1,d1,d0 | 2:1 |
| GPIO | N/A | N/A | N/A, use bypass path | N/A |
| DFX | N/A | N/A | N/A, use bypass path | N/A |

Various modifications to these embodiments are apparent to those skilled in the art from the description and the accompanying drawings. The principles associated with the various embodiments described herein may be applied to other embodiments. Therefore, the description is not intended to be limited to the embodiments shown along with the accompanying drawings but is to be providing broadest scope of consistent with the principles and the novel and inventive features disclosed or suggested herein. Accordingly, the invention is anticipated to hold on to all other such alternatives, modifications, and variations that fall within the scope of the present invention and appended claim.

It is to be understood that any prior art publication referred to herein does not constitute an admission that the publication forms part of the common general knowledge in the art.

The invention claimed is:

1. An I/O transmitter circuitry for supporting multi-mode serialization comprising a serializer, wherein said serializer comprising:
   multiple FIFO buffers;
   multiple flip-flops including a first latch, a second latch, a third flop and a fourth flop, to hold data ready and stage the data for subsequent multiplexing;
   a 0-degree shifted clock and a 90-degree shifted clock; and
   a multiplexer;
   wherein a read pointer reads one bit of data from each of the FIFO buffers;
   wherein the data is sampled into the respective flip-flops according to frequency of the 0-degree shifted clock and 90-degree shifted clock; and
   wherein the data is outputted by the 0-degree shifted clock and 90-degree shifted clock via the multiplexer.

2. The I/O transmitter circuitry as claimed in claim 1, wherein the serializer comprises four FIFO buffers, each coupled to one of the multiple flip-flops to support 4-to-1 serialization.

3. The I/O transmitter circuitry as claimed in claim 1, wherein the serializer further comprises three mux, each of the multiplexer is coupled to the 0-degree shifted clock, the 90-degree shifted clock and the third flop respectively to support 2-to-1 serialization.

4. The I/O transmitter circuitry as claimed in claim 1, wherein the serializer further comprises an additional mux added to first of the multiple FIFO buffers to support I/O equalization.

5. The I/O transmitter circuitry as claimed in claim 1, further comprising a bypass path from an external logic and a bypass mux to allow direct asynchronous communication and receiving mode termination.

6. The I/O transmitter circuitry as claimed in claim 1, further comprising an output enable pin to control output drivers drive strength and termination on a pad.

7. A method of operating an I/O transmitter circuitry for supporting 4-to-1 serialization, the method comprising:
   reading bits of data from each FIFO buffers by a read pointer;
   capturing an output from each FIFO buffers by two latches and two flops; and
   outputting the data from the two latches and two flops by a multiplexer based on a 0-degree shifted clock and a 90-degree shifted clock.

8. The method as claimed in claim 7, wherein reading bits of data including current data and future data simultaneously from each FIFO buffers by the read pointer for I/O equalization.

9. A method of operating an I/O transmitter circuitry for supporting 2-to-1 serialization, of the method comprising:
   reading bits of data from each FIFO buffers by a read pointer; and
   capturing an output from each FIFO buffers by a first and second latch and a first and a second flop;
   determining 2-to-1 mode serialization;
   operating 0-degree shifted clock to drive same clock signals;
   replacing a third flop path by said second latch; and
   outputting the data from the second latch or a fourth flop by a multiplexer.

10. The method as claimed in claim 9, wherein shifting data in the FIFO buffers to the left by 1 and doubling the data on every two FIFO locations before reading bits of data for I/O equalization.

11. The method as claimed in claim 10, wherein reading out future data and current data simultaneously from a FIFO without incurring additional cycle delay.

* * * * *